US006862433B2

(12) United States Patent
Callaway, Jr.

(10) Patent No.: US 6,862,433 B2
(45) Date of Patent: Mar. 1, 2005

(54) ANTENNA SYSTEM FOR A WIRELESS INFORMATION DEVICE

(75) Inventor: Edgar Herbert Callaway, Jr., Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 612 days.

(21) Appl. No.: 09/777,767

(22) Filed: Feb. 6, 2001

(65) Prior Publication Data

US 2002/0106995 A1 Aug. 8, 2002

(51) Int. Cl.[7] .................................................. H03C 7/02

(52) U.S. Cl. .................... 455/101; 455/277.1; 455/272; 455/562; 343/702; 375/267

(58) Field of Search ........................... 455/277.1, 277.2, 455/272, 101, 562, 575, 550, 566, 90, 344, 351, 347, 89, 550.1; 343/702, 700, 844, 893, 895, 825, 90; 375/267

(56) References Cited

U.S. PATENT DOCUMENTS

| | | | | |
|---|---|---|---|---|
| 5,373,300 A | | 12/1994 | Jenness et al. | 343/102 |
| 5,737,690 A | | 4/1998 | Gutman | 455/38.1 |
| 6,150,984 A | * | 11/2000 | Suguro et al. | 343/702 |
| 6,285,893 B1 | * | 9/2001 | Keirinbou | 455/575.7 |
| 6,411,826 B1 | * | 6/2002 | Camp, Jr. | 455/566 |
| 6,498,589 B1 | * | 12/2002 | Horii | 343/727 |
| 2002/0111194 A1 | * | 8/2002 | Behbahani et al. | 455/566 |

* cited by examiner

*Primary Examiner*—Lester G. Kincaid
*Assistant Examiner*—Khawar Iqbal
(74) *Attorney, Agent, or Firm*—Randi L. Karpinia

(57) ABSTRACT

A wireless information device (30) receives and processes a message (32) within a wireless information communication system (10). The wireless information device (30) includes an antenna system (62), a radio frequency switch (80), a controller (84) and a display (60). The antenna system has a plurality of antennas for receiving the message (32). The radio frequency switch (80) activates a first antenna (64) of the plurality of antennas as an active antenna (116) in response to an antenna control signal (98) sent from the controller (84). The antenna control signal (98) is generated by the controller (84) in response to the determination of the display orientation of the display (60).

22 Claims, 5 Drawing Sheets

ANTENNA SYSTEM FOR A WIRELESS INFORMATION DEVICE

BACKGROUND OF THE INVENTION

1. Field of the Invention

This invention relates in general to antenna systems and in particular to antenna systems for wireless information devices.

2. Description of the Related Art

The digital age has brought with it an abundance of options and availability of electronic information. Along with this explosion in electronic information is the availability of portable devices for using this information. For example, electronic books provide users with high quality electronic editions of books, magazines and newspapers. Users download over phone lines thousands of titles from the Internet site of the electronic book providers. As another example, portable web browsers provide users with access to the growing Internet sites to quickly and easily obtain whatever information they require wherever the user is and whenever it is needed usually via conventional telephone lines. The growing market for such portable electronic information devices has led to a growing popularity of wireless information. Wireless information devices allow the user the flexibility of access to the electronic information they desire or require without the additional requirement of telephone landline access.

Wireless information devices such as wireless web browsers and wireless electronic books can be used in multiple physical orientations relative to the user's body. The device can be oriented in the landscape format (short display side vertical), for such activities as web browsing or viewing slides, and then rotated to the portrait format (long display side vertical), for such activities as reading email or reading an electronic book. For maximum reading flexibility, some non-wireless electronic books allow the user to rotate the image in steps of ninety degrees so that, for example, the same side of the device can be held in either hand while reading.

Antenna design creates a challenge for the product designer of wireless information devices used for wireless web browsing or wireless electronic books. Since antenna performance is greatly dependent on the antenna's physical relationship with the body, achieving consistent antenna performance under the conditions surrounding the use of wireless information devices is challenging. No matter where the antenna is placed, depending upon the user's utilization of the product, the antenna can end up under the user's hand, or pressed against the body, resulting in reduced antenna performance.

One conventional approach to this design challenge is the use of antenna diversity. Antenna diversity involves choosing the best signal, or combination of signals, received from multiple antennas. One of the difficulties of this approach in portable products, getting enough space inside the product for the extra antennas, is less of a concern with wireless information devices, due the their relatively large size. However, diversity also requires additional power for the duplicate receiver signal paths required, and this can significantly affect product battery life. The addition of a duplicate receiver can also increase manufacturing cost of the device. There is also additional signal quality estimation that must be performed on the signal from each antenna. Lastly, a scheme for the choice of the proper transmit antenna is required. For these reasons, antenna diversity is not an optimum solution to this problem.

Alternatively, the product designer can either accept a reduction in wireless performance for some orientations of the wireless information device, or eliminate the ability for users to orient the wireless information device in the multiple orientations providing the most ergonomically pleasing orientation for each of a multiplicity of functions. Both of these options can reduce the utility and/or desirability of the wireless information device.

What is needed is an antenna system that allows the user to orient the wireless information device relative to the user's body in a multiplicity of orientations with consistent product performance without additional cost or size to the product.

DETAILED DESCRIPTION OF THE INVENTION

Figure 1:
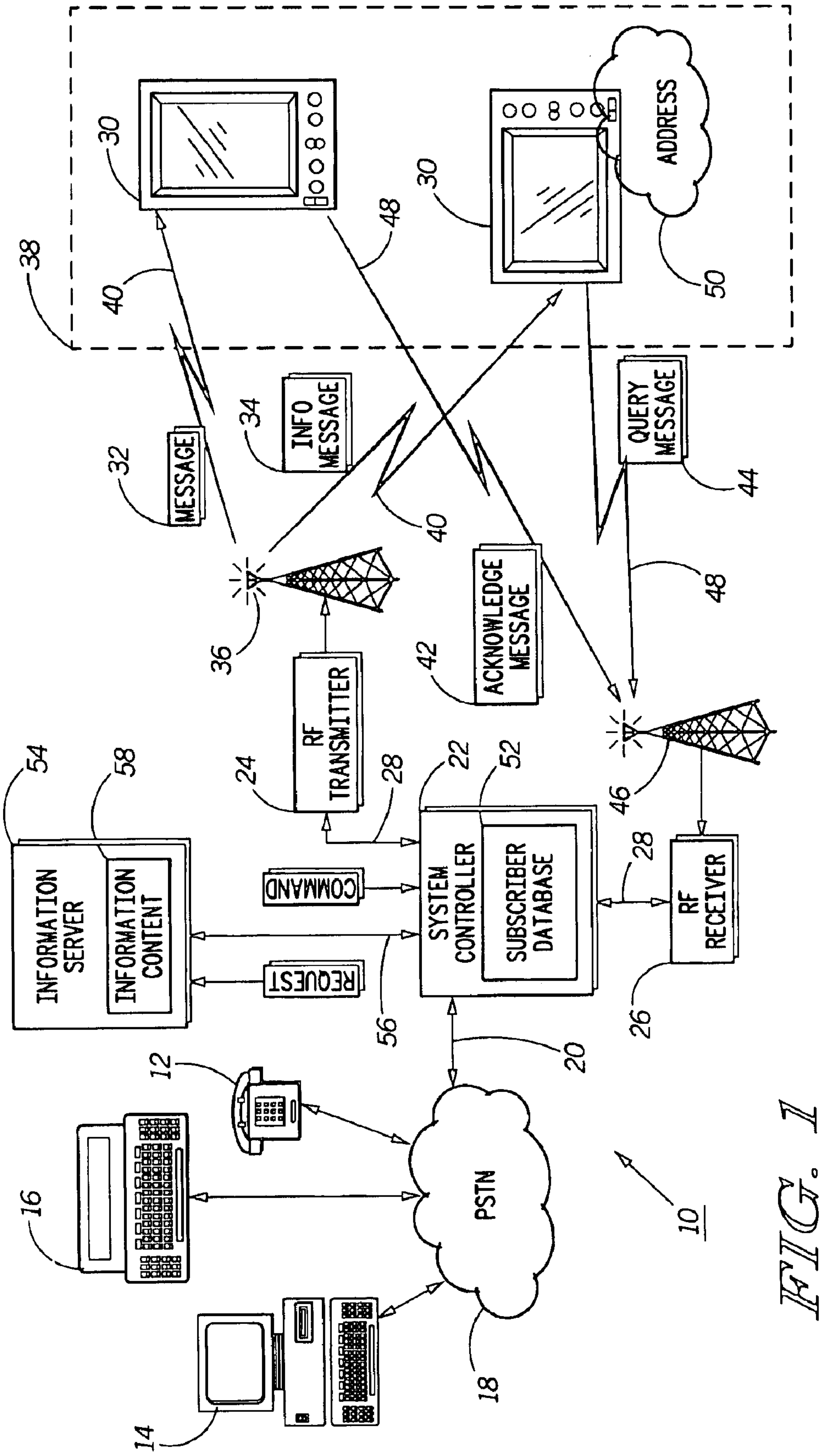
FIG. 1 is an electronic block diagram illustrating one embodiment of a wireless information communication system.

Referring to FIG. 1, an electronic block diagram of a wireless information communication system 10 is shown. The wireless information communication system 10 includes a message input device for initiating messages into the wireless information communication system 10. The message input device can be, for example, a telephone 12, a computer 14, or a desktop messaging unit 16, connected through a conventional public switched telephone network (PSTN) 18 through a plurality of telephone links 20 to a system controller 22. The telephone links 20, for example, can be a plurality of twisted wire pairs, a fiber optic cable, or a multiplexed trunk line.

The system controller 22 is coupled to and oversees the operation of at least one radio frequency (RF) transmitter 24 and at least one radio frequency (RF) receiver 26 through one or more communication links 28. The communication links 28 typically are twisted pair telephone wires, and additionally can include radio frequency (RF), microwave, or other communication links. The radio frequency transmitter 24 and the radio frequency receiver 26 typically are used with message store and forward stations that encode and decode inbound and outbound messages into formats that are compatible with landline message switched computers and personal radio addressing requirements, such as cellular messages, short messaging service, or paging protocols. The system controller 22 can also perform other functions; for example, it can encode and decode wireless messages that are transmitted to or received by the radio frequency transmitter 24 or the radio frequency receiver 26. Telephony signals are typically transmitted to and received from the system controller 22 by telephone sets such as the telephone 12 or a wireless information device 30. The system controller 22 encodes and schedules outbound messages such as a message 32 or an information message 34. The system controller 22 then transmits the encoded outbound messages through the radio frequency transmitter 24 via a transmit antenna 36 to a plurality of wireless information devices 38 such as a wireless information device 30 on at least one outbound radio frequency (RF) channel 40. The message 32 or the information message 34 can be, for example, a data message or a voice call. Similarly, the system controller 22 receives and decodes inbound messages such as an acknowledgement message 42 or a query message 44 received by the radio frequency receiver 26 via a receive antenna 46 on at least one inbound radio frequency (RF) channel 48 from one of the plurality of wireless information devices 38. The acknowledgement message 42 or the query message 44 can be, for example, a data message, a reply to a data message, a voice call, or a reply to a voice call.

It will be appreciated by one of ordinary skill in the art that the wireless information communication system 10, in accordance with the present invention, can function utilizing any wireless RF channel, for example, a one- or two-way pager channel, a mobile cellular telephone channel, or a mobile radio channel. Similarly, it will be appreciated by one of ordinary skill in the art that the wireless information communication system 10 can function utilizing other types of communication channels such as infrared channels. In the following description, the term "wireless information communication system" refers to any of the wireless information communication systems mentioned above or an equivalent.

Similarly, it will be appreciated by one of ordinary skill in the art that the wireless information device 30 in accordance with the present invention, can be a mobile cellular telephone, a mobile radio data terminal, a mobile cellular telephone having an attached data terminal, or a two-way pager, such as the "Pagewriter 2000X" manufactured by Motorola Inc. of Schaumburg, Ill. In the following description, the term "wireless information device" refers to any of the devices mentioned above or an equivalent.

The wireless information device 30 assigned for use in the wireless information communication system 10 has an address 50 or identity assigned thereto which is a unique selective call address in the wireless information communication system 10. It will be appreciated by one of ordinary skill in the art that other wireless information devices assigned for use in the wireless information communication system 10 have an address assigned thereto which is a unique selective call address in the wireless information communication system 10.

The address 50 enables the transmission of the message 32 or the information message 34 from the system controller 22 only to the wireless information device 30 having the address 50, and identifies the messages and responses such as the acknowledgement message 42 or the query message 44 received at the system controller 22 from the wireless information device 30 with the address 50. In one embodiment, each of the plurality of wireless information devices 38 also has a pin number assigned thereto, the pin number being associated with a telephone number within the PSTN 18. A list of the assigned addresses and correlated telephone numbers for each wireless information device 30 is stored in the system controller 22 in the form of a subscriber database 52.

In a preferred embodiment of the present invention, the wireless information communication system 10 includes an information server 54 coupled to the system controller 22 via a server interface 56. The information server 54 controls and manages communication of a plurality of information content 58 to the plurality of wireless information devices 38 by sending wireless messages to the plurality of wireless information devices 38. The information content 58 can be, for example, electronic books, Internet web page information, or the like. The addition of the information server 54 to the wireless information communication system 10 enhances the operation of the wireless information communication system 10 by adding intelligence for the management of the information content 58 including the communication among and to the plurality of wireless information devices 38.

Figure 2:
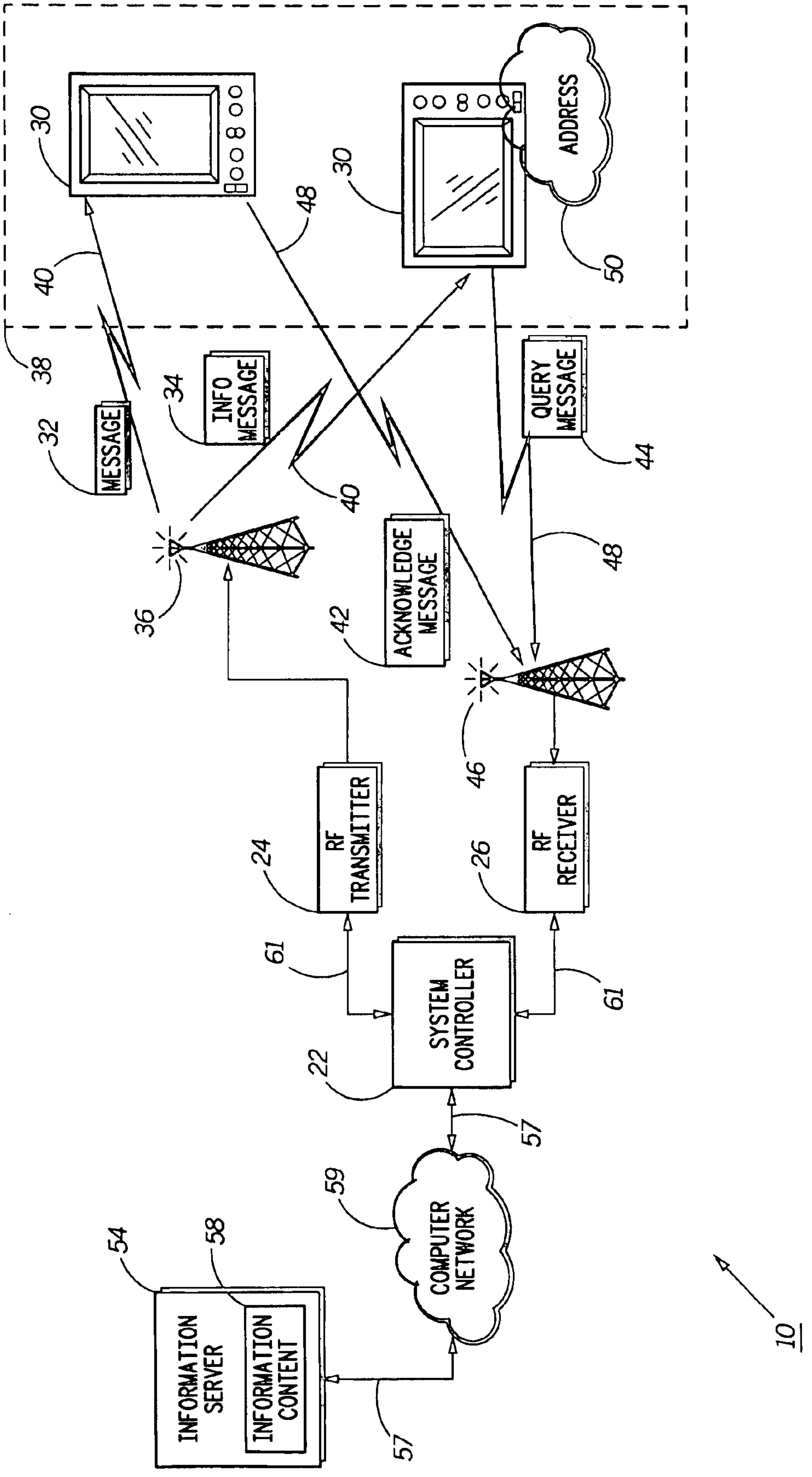
FIG. 2 is an electronic block diagram illustrating an alternative embodiment of a wireless information communication system.

Referring to FIG. 2, an alternative embodiment of the wireless information communication system 10 includes the information server 54 as a source of the information content 58 to the wireless information communication system 10. The information server 54 is coupled through a computer network 59 through a plurality of computer communication links 57 to the system controller 22. The computer network 59, for example, can be the Internet. The computer communication links 57, for example, can be a plurality of twisted wire pairs, cable television cables, telephone Digital Subscriber Lines (DSL), fiber optic cables, or multiplexed trunk lines.

The system controller 22 is coupled to and oversees the operation of at least one radio frequency (RF) transmitter 24 and at least one radio frequency (RF) receiver 26 through one or more information communication links 61. The information communication links 61 typically are metallic connections on a printed circuit board or integrated circuit, and additionally can include radio frequency (RF), microwave, or other communication links. The radio frequency transmitter 24 and the radio frequency receiver 26 typically encode and decode inbound and outbound messages into formats that are compatible with landline packet switched computers and personal radio addressing requirements, such as Wireless Personal Area Networks (WPANs) or Wireless Local Area Networks (WLANs). Examples of WPANs are networks based on the Bluetooth, HomeRF, and IEEE 802.15.3 protocols; examples of WLANs are networks based on the Hiperlan 2, IEEE 802.11a, and 802.11.b protocols. The system controller 22 can also perform other functions; for example, it can encode and decode wireless messages that are transmitted to or received by the radio frequency transmitter 24 or the radio frequency receiver 26. Telephony signals are typically transmitted to and received from the system controller 22 by the computer network 59 or the wireless information device 30. The system controller 22 encodes and schedules outbound messages such as the message 32 or the information message 34. The system controller 22 then transmits the encoded outbound messages through the radio frequency transmitter 24 via a transmit antenna 36 to the plurality of wireless information devices 38 such as the wireless information device 30 on at least one outbound radio frequency (RF) channel 40. The message 32 or the information message 34 can be, for example, a data message or a voice call. Similarly, the system controller 22 receives and decodes inbound messages such as the acknowledgement message 42 or the query message 44 received by the radio frequency receiver 26 via the receive antenna 46 on at least one inbound radio frequency (RF) channel 48 from one of the plurality of wireless information devices 38. The acknowledgement message 42 or the query message 44 can be, for example, a data message, a reply to a data message, a voice call, or a reply to a voice call.

It will be appreciated by one of ordinary skill in the art that the wireless information communication system 10, in accordance with the present invention, can function utilizing any wireless RF channel, for example, a one or two-way pager channel, a mobile cellular telephone channel, a WPAN or WLAN channel, or a mobile radio channel. Similarly, it will be appreciated by one of ordinary skill in the art that the wireless information communication system 10 can function utilizing other types of communication channels such as infrared channels. In the following description, the term "wireless information communication system" refers to any of the wireless information communication systems mentioned above or an equivalent.

Figure 3:
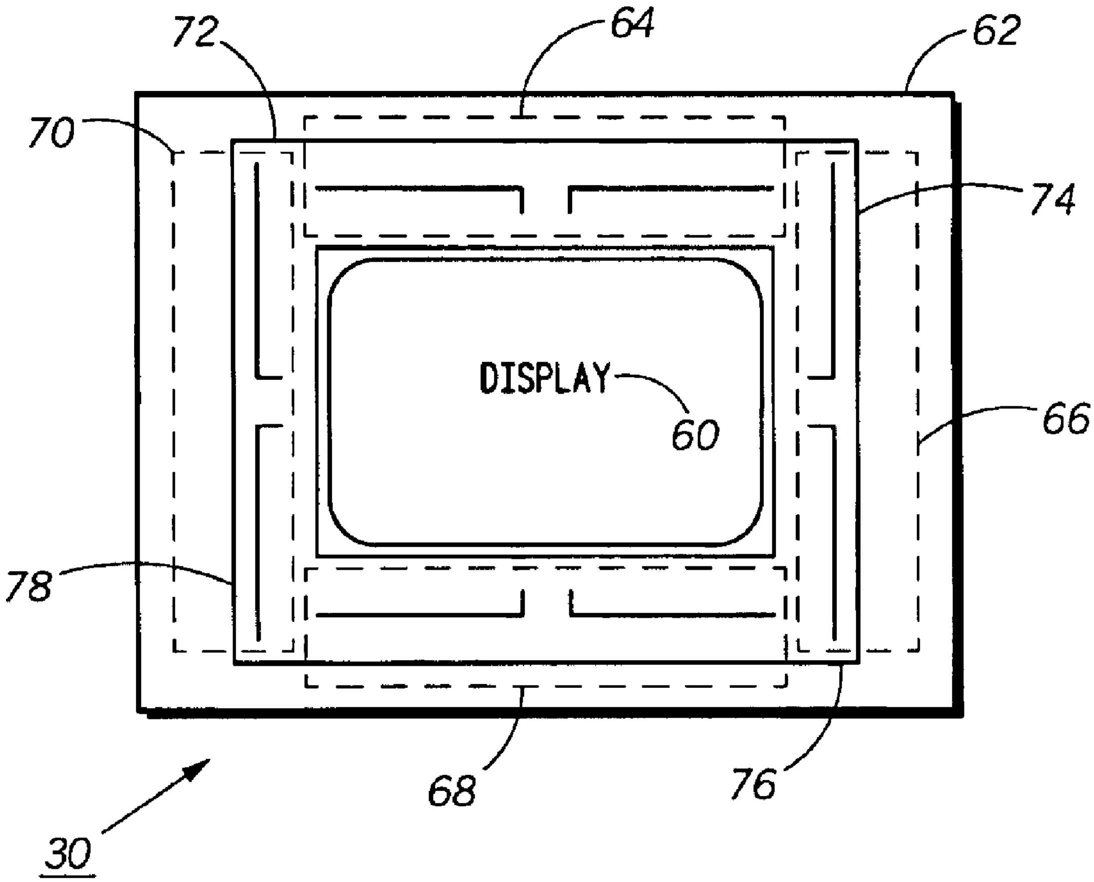
FIG. 3 illustrates a wireless information device for use within the wireless information communication system of FIG. 1.

FIG. 3 illustrates the wireless information device 30 for use within the wireless information communication system 10 of FIG. 1 or FIG. 2. It will be appreciated by one of ordinary skill in the art that FIG. 3 is illustrative of each of the plurality of wireless information devices 38 assigned for use in the wireless information communication system 10. The wireless information device 30, as illustrated in FIG. 3 includes a display 60 and an antenna system 62. The antenna system 62, in accordance with the present invention includes multiple antennas widely separated in the wireless information device 30. Preferably, the antenna system 62 includes a first antenna 64, a second antenna 66, a third antenna 68, and a fourth antenna 70. The first antenna 64 is preferably located near and parallel to a top side 72 of the wireless information device 30. The second antenna 66 is preferably located near and parallel to a right side 74 of the wireless information device 30. The third antenna 68 is preferably located near and parallel to a bottom side 76 of the wireless information device 30. The fourth antenna 70 is preferably located near and parallel to a left side 78 of the wireless information device 30. The first antenna 64 and the third antenna 68 are substantially parallel to each other. The second antenna 66 and the fourth antenna 70 are substantially parallel to each other. The first antenna 64 and the third antenna 68 are substantially perpendicular to the second antenna 66 and the fourth antenna 70. The first antenna 64, the second antenna 66, the third antenna 68, and the fourth antenna 70 surround the circumference of the display 60.

It will be appreciated by one skilled in the art that the antenna system 62 in accordance with the present invention can be formed as described herein or in an equivalent manner. For example, the antenna system 62 as illustrated in FIG. 3 uses four antennas placed in two different orientations. Other orientations and quantities of antennas can be used within the spirit of the present invention. For example, the wireless information device 30 can use two directional antennas that are oriented in generally opposing directions relative to a point in the device.

Figure 4:
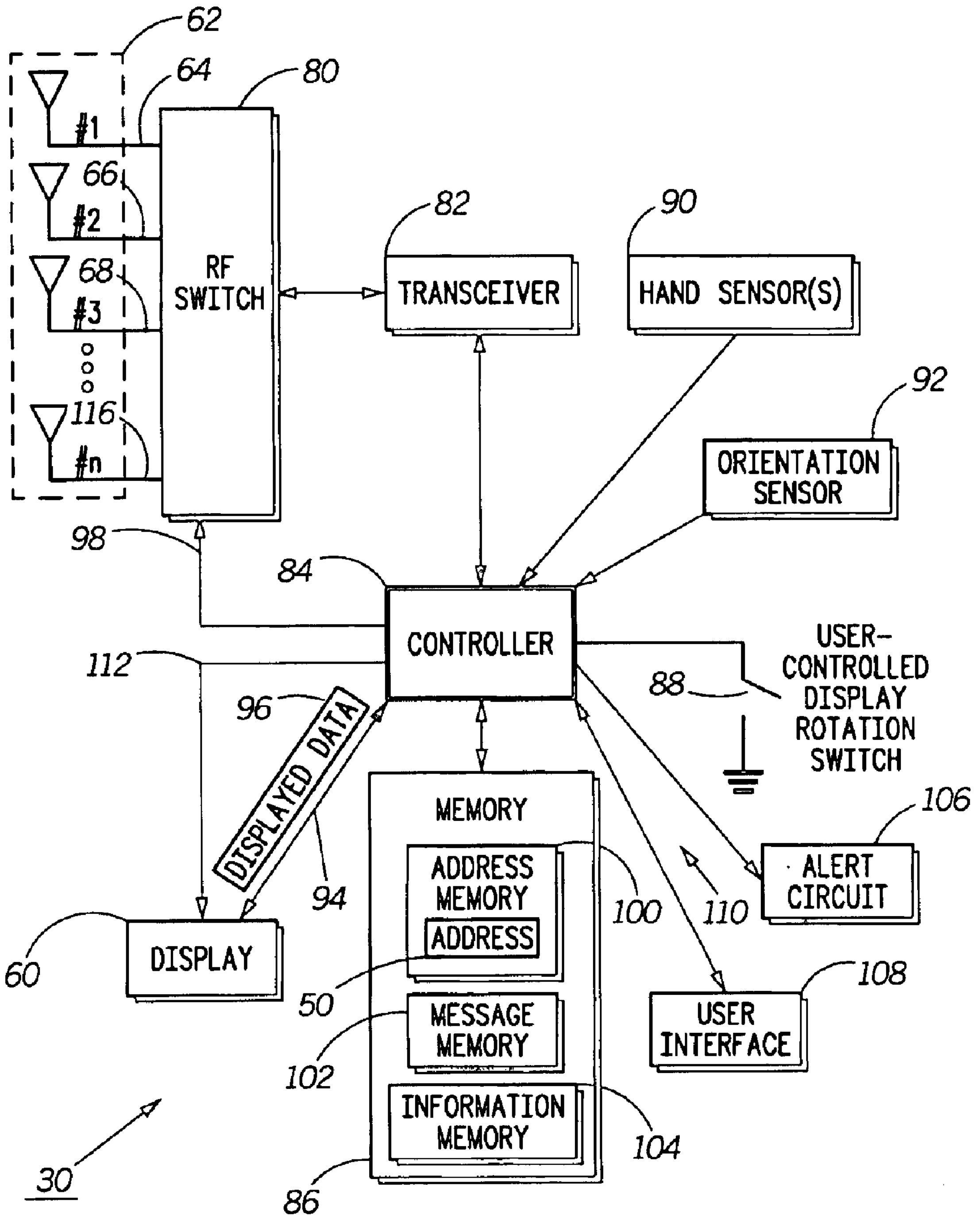
FIG. 4 is an electronic block diagram of a wireless information device for use within the wireless information communication system of FIG. 1 in accordance with the present invention.

FIG. 4 is electronic block diagram of a preferred embodiment of the wireless information device 30 for use within the wireless information communication system 10. It will be appreciated by one of ordinary skill in the art that the electronic block diagram of FIG. 3 is illustrative of each of the plurality of wireless information devices 38 assigned for use in the wireless information communication system 10.

Referring to FIG. 4, the wireless information device 30 includes the antenna system 62, a radio frequency (RF) switch 80, a transceiver 82, a controller 84, a memory 86, the display 60, an alert circuit 106, a user interface 108, and a user controlled display rotation switch 88. The wireless information device 30 preferably also includes a plurality of hand sensors 90 and an orientation sensor 92.

The antenna system 62 intercepts transmitted signals from the wireless information communication system 10. The antenna system 62 is coupled to the transceiver 82 through the RF switch 80. The transceiver 82 employs conventional demodulation techniques for receiving the communication signals transmitted by the wireless information communication system 10 such as the message 32 or the information message 34 of FIG. 1. Further, the transceiver 82 is responsive to commands from the controller 84. When the transceiver 82 receives a command from the controller 84, the transceiver 82 sends a signal via the antenna system 62 to the wireless information communication system 10 such as the acknowledgement message 42 or the query message 44 (see FIG. 1).

In an alternative embodiment (not shown), the wireless information device 30 includes a receiver circuit and a transmitter circuit for performing the functionality of the transceiver 82. It will be appreciated by one of ordinary skill in the art that other similar electronic block diagrams of the same or alternate type can be utilized for the wireless information device 30 to handle the requirements of the transceiver 82.

Coupled to the transceiver 82 is the controller 84 utilizing conventional signal processing techniques for processing received messages. Preferably, the controller 84 is similar to the MC68328 micro-controller manufactured by Motorola, Inc. of Schaumburg, Ill. It will be appreciated by one of ordinary skill in the art that other similar processors can be utilized for the controller 84, and that additional processors of the same or alternative type can be utilized as required to handle the processing requirements of the controller 84.

The controller 84 decodes an address in the demodulated data of the received message, compares the decoded address with one or more addresses such as the address 50 stored in an address memory 100 of the memory 86; and when a match is detected, proceeds to process the remaining portion of the received message.

To perform the necessary functions of the wireless information device 30, the controller 84 is coupled to the memory 86, which preferably includes a random access memory (RAM), a read-only memory (ROM), and an electrically erasable programmable read-only memory (EEPROM)(not shown). The memory 86 also includes the address memory 100, a message memory 102, and an information memory 104.

Once the controller 84 has processed a received message such as the message 32, it stores the decoded message in the message memory 102. The received message, for example, can be a notification of an update to a web page ready for download or a notification of the availability of a new electronic book. It will be appreciated by one of ordinary skill in the art that the message memory 102, in accordance with the present invention, can be a voicemail box or a group of memory locations in a data storage device. In the following description, the term "message memory" refers to any of the memory means mentioned above or an equivalent.

Once the controller 84 has processed a received information message such as the information message 34, it stores the decoded information included in the information message 34 in the information memory 104. The decoded information can be, for example, an electronic book, a web page, or an Internet document. It will be appreciated by one of ordinary skill in the art that the information memory 104, in accordance with the present invention, can be a group of memory locations in a data storage device. In the following description, the term "message memory" refers to any of the memory means mentioned above or an equivalent.

Upon receipt and processing of the message 32 or the information message 34, the controller 84 preferably generates a display command 94 to the display 60 to generate a visual notification of the receipt and storage of the message or the information. When the display 60 receives the display command 94 from the controller 84 that the message has been received and stored, a message indication is displayed. The message indication, for example can be the activation of one of a plurality of message icons on the display 60. The display 60 can be, for example, a liquid crystal display utilized to display text. It will be appreciated by one of ordinary skill in the art that other similar displays such as dot matrix displays can be utilized for the display 60.

Alternatively, upon receipt and processing of the message 32 or the information message 34, the controller 84 generates the display command 94 to the display 60 to generate a visual image substantially representing at least a portion of the information received in the message 32 or the information message 34.

Upon receipt and processing of the message 32 or the information message 34, the controller 84 preferably also generates a command signal to the alert circuit 106 to notify the device user that the message has been received and stored. The alert circuit 106 can include a speaker (not shown) with associated speaker drive circuitry capable of playing melodies and other audible alerts, a vibrator (not shown) with associated vibrator drive circuitry capable of producing a physical vibration, or one or more LEDs (not shown) with associated LED drive circuitry capable of producing a visual alert. It will be appreciated by one of ordinary skill in the art that other similar alerting means as well as any combination of the audible, vibratory, and visual alert outputs described can be used for the alert circuit 106.

Preferably, the user interface 108 is coupled to the controller 84, as shown in FIG. 4. The user interface 108 can be one or more buttons used to generate a button press, a series of button presses, a voice response from the device user, or some other similar method of manual response initiated by the device user of the wireless information device 30. The controller 84 is responsive to signals received from the user interface 108.

Upon receipt of a user interface signal 110 from the user interface 108, including instructions to display a particular information data stored in the message memory 102 or in the information memory 104, the controller 84 is programmed to send the display command 94 to the display 60 including a plurality of displayed data 96 received in the message 32 or information message 34 and stored in the message memory 102 or in the information memory 104. The display 60, in response to receipt of the plurality of displayed data 96, generates a visual display that substantially represents at least a portion of the information.

Upon receipt of the user interface signal 110 from the user interface 108, including instructions to query the information server 54 of FIG. 2, the controller 84 commands the transceiver 82 to send a signal via the antenna system 62 to the wireless information communication system 10 such as the acknowledgement message 42 or the query message 44. Preferably, the controller 84 also sends the display command 94 to the display 60 to modify the displayed image, indicating to the user that action was taken in response to user interface signal 110. It will be appreciated by one of ordinary skill in the art that, the controller can send the display command 94 to the display 60 independently rather than in response to either the user interface signal 110, the message 32, or the information message 34.

To perform the necessary functions of the wireless information device 30, the controller 84 is coupled to the RF switch 80. The controller 84 controls the RF switch 80 by sending an antenna control signal 98 to the RF switch 80. Upon receipt of the antenna control signal 98, the RF switch 80 determines which of the multiple antennas of the antenna system 62 is an active antenna 116. The antenna switching of the antenna system 62 is preferably based on factors other than qualities of the radio frequency communications link.

In one embodiment, the user-controlled display rotation switch 88 is coupled to the controller 84. The device user opens and closes the user-controlled display rotation switch 88 dependent upon which orientation of the display 60 is desired and/or required. In other words, the user-controlled display rotation switch 88 changes modes from open to close or from close to open dependent upon which orientation of the display 60 is desired and/or required. In response, the controller 84 sends a display orientation control signal 112 to the display 60. In response to receipt of the display orientation control signal 112, the display 60 modifies its display orientation. Further, the controller 84 sends the antenna control signal 98 to the RF switch 80 identifying the new display orientation. The RF switch 80, in response to receipt of the antenna control signal 98, switches which of the plurality of antennas of the antenna system 62 is the active antenna 116 to the one most likely to have optimum performance.

Alternatively, the orientation sensor 92 is coupled to the controller 84. The orientation sensor 92 determines the orientation of the display 60 and notifies the controller 84 accordingly. In response, the controller 84 sends the antenna control signal 98 to the RF switch 80 identifying the display orientation. The RF switch 80, in response to receipt of the antenna control signal 98, switches which of the plurality of antennas of the antenna system 62 is the active antenna 116 to the one most likely to have optimum performance. Typically, the antenna of the antenna system 62 located at the top of the display 60 based on the display orientation is chosen as the active antenna 116, that being the antenna most likely to be free of the hands and away from the body. Preferably, the orientation sensor 92 is sensitive to gravity and can be, for example, a set of mercury switches that determine the direction of "up" and "down". It will be appreciated by one of ordinary skill in the art that other similar gravity sensitive detection means, as well as other orientation determination means, can be used for the orientation sensor 92. It will be appreciated by one skilled in the art that a certain amount of hysteresis would be needed to control unnecessary switching between antennas in certain orientations (i.e.: when the wireless information device 30 is lying flat on a table).

Alternatively, the plurality of hand sensors 90 is coupled to the controller 84. Each of the plurality of hand sensors 90 can be, for example, capacitive sensors or phototransistors. It will be appreciated by one of ordinary skill in the art that other similar hand sensor means as well as any combination of those described can be used for the plurality of hand sensors 90. Each of the plurality of hand sensors 90 is placed near each antenna. The controller 84 receives a signal from each of the plurality of hand sensors 90 indicating the amount of obstruction related to the associated antenna. The controller 84 then chooses the antenna with the hand sensor indicating the least obstruction (the lowest capacitance or the most light, relative to the other sensors in the wireless information device 30) to be the active antenna 116. It will be appreciated by one skilled in the art that a certain amount of hysteresis would be needed to control undesired switching between two antennas with similar sensor values. The controller 84 then sends the antenna control signal 98 to the RF switch 80 identifying the active antenna 116. The RF switch 80, in response to receipt of the antenna control signal 98, switches the active antenna 116 of the antenna system 62 to the one most likely to have optimum performance as specified by the controller 84.

It will be appreciated by one skilled in the art that the controller 84 can combine the methods described herein to determine the optimum antenna to be utilized. For example, the controller 84 can use the display orientation method to make a decision if the spatial orientation method provides indeterminate results (i.e.: when the wireless information device 30 is lying flat on a table).

The user may, through a "preferences" entry of the user interface 108, modify the above antenna selection criteria to cover special circumstances. For example, the user may wish to modify the hand detection algorithm under unusual lighting conditions, if the phototransistor method of hand detection is used.

Figure 5:
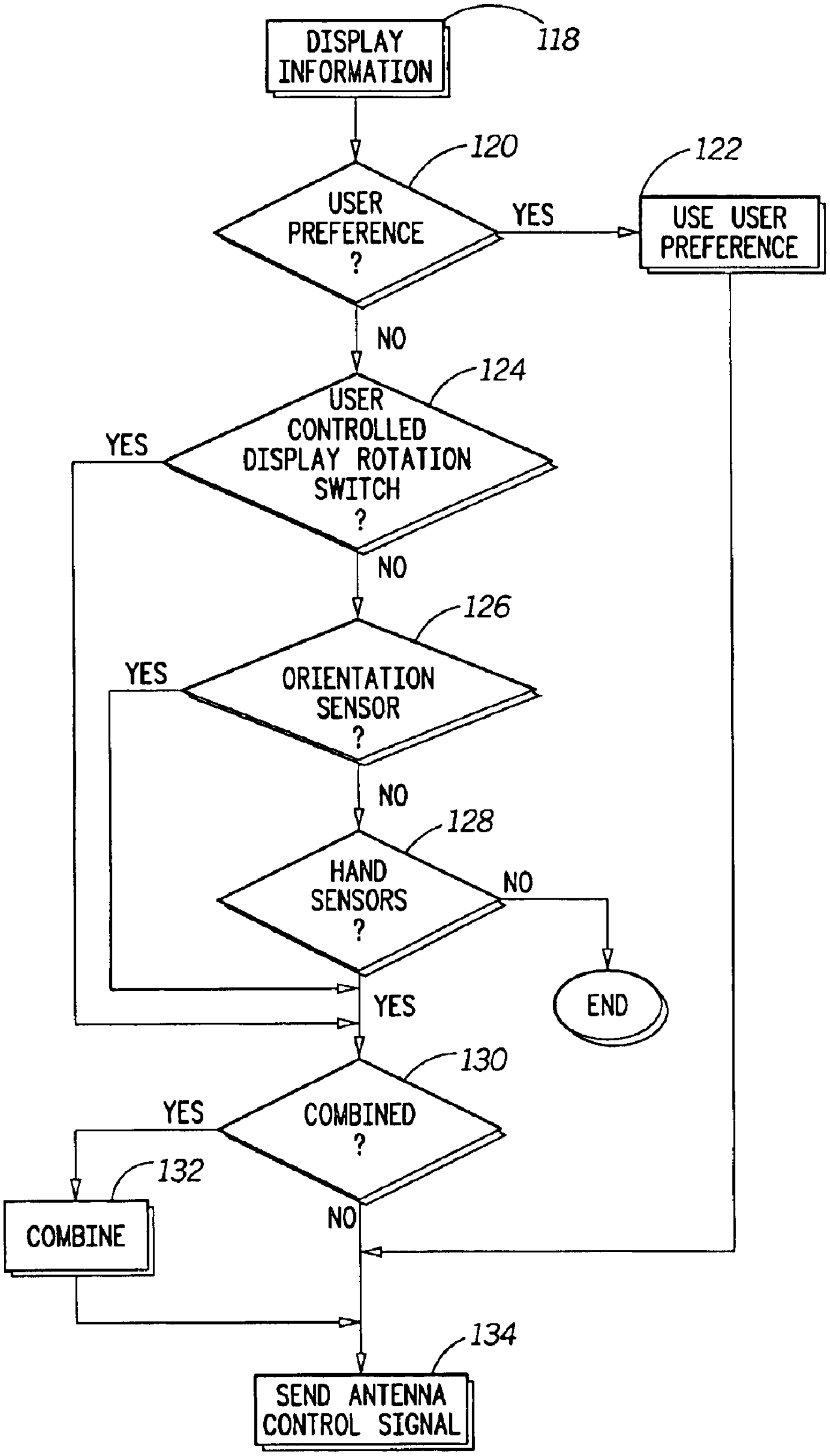
FIG. 5 is a flowchart illustrating one embodiment of the operation of the wireless information device of FIG. 3 in accordance with the present invention.

FIG. 5 is a flowchart illustrating one embodiment of the operation of the controller 84 of the wireless information device 30 of FIG. 4 in accordance with the present invention. Specifically, FIG. 5 illustrates the operation of the controller 84 in determining the information to be sent in the antenna control signal 98 to the RF switch 80. It will be appreciated by one of ordinary skill in the art that the operation in FIG. 5 is illustrative of the operation of the plurality of wireless information devices 38 assigned for use in the wireless information communication system 10.

Referring to FIG. 5, in Step 118, the wireless information device 30 displays information on the display 60. For example, display 60, in response to receipt of the plurality of displayed data 96 from the controller 84 generates a visual display of the information. Next, in Step 120, the controller 84 determines if a user preference has been identified. The user may, through a "preferences" entry of the user interface 108, modify the above antenna selection criteria to cover special circumstances. When a user preference has been received by the controller 84 through the user interface 108, in Step 122 the user preference is implemented. In Step 124, when no user preference has been received by the controller 84, the controller 84 determines whether the user controlled display rotation switch 88 has been utilized. In Step 126, when no activity is detected on the user controlled display rotation switch 88, the controller 84 determines whether an orientation sensor 92 is present and active. In Step 128, when the orientation sensor 92 is not present or the orientation sensor 92 is not active, the controller 84 determines whether the plurality of hand sensors 90 are present or active. When the plurality of hand sensors 90 are not present or not active, the process ends.

In Step 130, when either the user controlled display rotation switch 88 is utilized in Step 124, or the orientation sensor 92 is active in Step 126, or the plurality of hand sensors 90 are active in Step 128, the controller 84 determines whether it has been programmed to combine some combination of these inputs. In Step 132, when a combination is required or desired, the controller 84 combines inputs from more than one of the inputs. Next, in Step 134, and when no combination is required or desired in Step 130, and also when the user preference is used from Step 122, the controller 84 sends the antenna control signal 98 to the RF switch 80.

The present invention, as described herein provides an efficient and effective antenna system for use with a wireless information device. The present invention provides, within the wireless information device, a method and apparatus for automatically switching between a plurality of antennas each oriented in a different direction to provide enhanced communications performance within a wireless communication system.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A wireless information device within a wireless information communication system for receiving and processing a message, the wireless information device comprising:

an antenna system having a plurality of antennas for receiving the message;

a radio frequency switch coupled to the antenna system for activating a first antenna of the plurality of antennas as an active antenna in response to first antenna control signal;

a transceiver coupled to the radio frequency switch for receiving the message from the antenna system through the radio frequency switch, and further for sending a signal to the antenna system in response to a command;

a controller coupled to the radio frequency switch and to the transceiver for processing the message and further for sending the first antenna control signal to the radio frequency switch and further for sending the command to the transceiver;

a memory coupled to the controller for storing the message; and a display coupled to the controller for displaying the message in response to a display command from the controller, wherein the display includes a first display orientation, and further wherein the controller is adapted to:

receive the first display orientation, and generate the first antenna control signal, wherein the first antenna control signal is determined by the first display orientation.

2. A wireless information device as recited in claim 1, wherein the wireless information device further comprises:

a user interface coupled to the controller for sending a user interface signal to the controller, wherein the controller sends the display command to the display in response to receipt of the user interface signal.

3. A wireless information device as recited in claim 1, wherein the wireless information device further comprises:

a user controlled display rotation switch coupled to the controller, wherein the controller sends a display orientation signal to the display in response to a change in mode of the user controlled display rotation switch, and further wherein the display changes display orientation in response to receipt of the display orientation signal.

4. A wireless information device as recited in claim 3 wherein the controller sends the antenna control signal associated with a second display orientation of the display to the radio frequency switch in response to a change in mode of the user controlled display rotation switch, and further wherein the radio frequency switch activates a second antenna of the plurality of antennas of the antenna system as the active antenna in response to receipt of the second antenna control signal.

5. A wireless information device as recited in claim 1, wherein the wireless information device further comprises:

a plurality of hand sensors coupled to the controller, wherein the controller receives a signal from at least one of the plurality of hand sensors, and further wherein the controller sends a second antenna control signal to the radio frequency switch in response to receiving the signal from at least one of the plurality of hand sensors, and further wherein the radio frequency switch activates a second antenna of the plurality of antennas of the antenna system as the active antenna in response to receipt of the second antenna control signal.

6. A wireless information device as recited in claim 1, wherein the wireless information device further comprises:

an orientation sensor coupled to the controller for determining the display orientation, wherein the controller receives a signal from the orientation sensor, and further wherein the controller sends a second antenna control signal associated with the second display orientation to the radio frequency switch in response to receiving the signal from the orientation sensor, and further wherein the radio frequency switch activates a second antenna of the plurality of antennas of the antenna system as the active antenna in response to receipt of the second antenna control signal.

7. A wireless information device as recited in claim 1, wherein the wirelss information device further comprises:

a user controlled display rotation switch coupled to the controller, wherein the controller sends a display orientation signal to the display in response to a change in mode of the user controlled display rotation switch, and further wherein the display changes display orientation in response to receipt of the display orientation signal.

8. A wireless information device as recited in claim 7, wherein the controller further sends the antenna control signal to the radio frequency switch in responsee to a change in mode of the user controlled display rotation switch.

9. A wireless information device within a wireless information communication system for receiving and processing a message, the wireless information device comprising:

an antenna system having a plurality of antennas for receiving the message;

a radio frequency switch coupled to the antenna system for activating a first antenna of the plurality of antennas as an active antenna in response to a first antenna control signal;

a receiver coupled to the radio frequency switch for receiving the message from the system through the radio frequency switch;

a controller coupled to the radio frequency switch and to the receiver for processing the message and further for sending the antenna control signal to the radio frequency switch;

a memory coupled to the controller for storing the message; and a display coupled to the controller for displaying the message in response to a display command from the controller, wherein the display includes a first display orientation, and further wherein the controller is adapred to:

receive the first display orientation, and generate the first antenna control signal, wherein the first antenna control signal is determined by the first display orientation.

10. A wireless information device as recited in claim 9, wherein the wireless information device further comprises:

a user interface coupled to the controller for sending a user interface signal to the controller, wherein the controller sends the display command to the display in response to receipt of the user interface signal.

11. A wireless information device as recited in claim 9, wherein the wireless information device further comprises:

a user controlled display rotation switch coupled to the controller, wherein the controller sends a display orientation signal to the display in response to a change in mode of the user controlled display rotation switch, and further wherein the display changes display orientation in response to receipt of the display orientation signal.

12. A wireless information device as recited in claim 11 wherein the controller sends a second antenna control signal associated with a second display orientation of the display to the radio frequency switch in response to a change in mode of the user controlled display rotation switch, and further wherein the radio frequency switch activates a second antenna of the plurality of antennas of the antenna system as the active antenna in response to receipt of the second antenna control signal.

13. A wireless information device as recited in claim 9, wherein the wireless information device further comprises:

a plurality of hand sensors coupled to the controller, wherein the controller receives a signal from at least one of the plurality of hand sensors, and further wherein the controller sends a second antenna control signal to the radio frequency switch in response to receiving the signal from at least one of the plurality ofhand sensors, and further wherein the radio frequency switch activates a second antenna of the plurality of antennas of the antenna system as the active antenna in response to receipt of the second antenna control signal.

14. A wireless information device as recited in claim 9, wherein the wireless information device further comprises:

an orientation sensor coupled to the controller for determining a second display orientation, wherein the controller receives a signal from the orientation sensor, and further wherein the controller sends a second antenna control signal associated with teh second display orientation to the radio frequency switch in response to receiving the signal from the orientation sensor, and further wherein the radio frequency switch activates a second antenna of the plurality of antennas of the antenna system as the active antenna in response to receipt of the second antenna control signal.

15. A wireless information device as recited in claim 9, wherein the wireless information device further comprises:

a user controlled display rotation switch coupled to the controller, wherein the controller sends a display orientation signal to the display in response to a change in mode of the user controlled display rotation switch, and further wherein the display changes display orientation in response to receipt of the display orientation signal.

16. A wireless information device as recited in claim 15 wherein the controller sends the antenna control signal to the radio frequency switch in response to a change in mode of the user controlled display rotation switch.

17. A wireless information device within a wireless information communication system for receiving and processing a message, the wireless information device comprising:

an antenna system having a plurality of antennas for receiving the message;

a radio frequency switch coupled to the antenna system for activating a first antenna of the plurality of antennas as an active antenna in response to an antenna control signal;

a transceiver coupled to the radio frequency switch for receiving the message from the antenna system through the radio frequency switch, anf further for sending a signal to the antenna system in response to a command;

a controller coupled to the radio frequency switch and to the transceiver for processing the message and further for sending the antenna control signal to the radio frequency switch and further for sending the command to the transceiver;

a memory coupled to the controller for storing the message;

a display coupled to the controller for displaying the message in response to a display command from the controller, wherein the display includes a display orientation, and further wherein the antenna control signal is generated by the controller in response to the display orientation; and a plurality of hand sensors coupled to the controller, wherein the controller receives a signal from at least one of the plurality of hand sensors, and further wherein the controller sends the antenna control signal to the radio frequency switch in response to recieving the signal from at least one of the plurality of hand sensors, and further wherein the radio frequency switch activates a second antenna of teh plurality of antennas of the antenna system as the active antenna in response to receipt of the antenna control signal.

18. A wireless information device as recited in claim 17, wherein the wireless information device further comprises:

a user interface coupled to the controller for sending a user interface signal to the controller, wherein the controller sends the display command to the display in response to receipt of the user interface signal.

19. A wireless information device as recited in claim 17, wherein the wireless information device further comprises:

an orientation sensor coupled to the controller for determing the display orientation, wherein the controller recieves a signal from the orientation sensor, and further wherein the controller sends the antenna control signal to the radio frequency switch in response to receiving the signal from the orientation sensor.

20. A wireless information device within a wireless information communication system for receiving and processing a message, the wireless information device comprising:

an antenna system having a plurality of antennas for receiving the message;

a radio frequency switch coupled to the antenna system for activating a first antenna of the plurality of antennas as an active antenna in response to an antenna control signal;

a receiver coupled to the radio frequency switch for receiving the message from the antenna system through the radio frequency switch;

a controller coupled to the radio frequency switch and to the receiver for processing the message and further for sending the antenna control signal to the radio frequency switch;

a memory coupled to the controller for storing the message;

a display coupled to the controller for displaying the message in response to a display command from the controller, whereing the display includes a display orientation, and further wherein the antenna control signal is generated by the controller in response to teh display orientation; and a plurality of hand sensors coupled to the controller, wherein the controller receives a signal from at least one of the plurality of hand sensors, and further wherein the controller sends the antenna control signal to the radio frequency switch in response to receiving the signal from at least one of the plurality of hand sensors, and further wherein the radio frequency switch activates a second antenna of the plurality of antennas of the antenna system as the active antenna in response to receipt of the antenna control signal.

21. A wireless information device as recited in claim 20, wherein the wireless information device further comprises:

a user interface coupled to the controller for sending a user interface signal to the controller, wherein the controller sends the display command to the display in response to receipt of the user interface signal.

22. A wireless information device as recited in claim 20, wherein the wireless information device further comprises:

an orientation sensor coupled to the controller for determining the display orientation, wherein the controller receives a signal from the orientation sensor, and further wherein the controller sends the antenna control signal to the radio frequency switch in response to receiving the signal from the orientation sensor.

* * * * *